(12) United States Patent
Yeh et al.

(10) Patent No.: US 11,183,558 B2
(45) Date of Patent: Nov. 23, 2021

(54) NANOSHEET TRANSISTOR HAVING PARTIALLY SELF-LIMITING BOTTOM ISOLATION EXTENDING INTO THE SUBSTRATE AND UNDER THE SOURCE/DRAIN AND GATE REGIONS

(71) Applicant: International Business Machines Corporation, Armonk, NY (US)

(72) Inventors: Chun-Chen Yeh, Danbury, CT (US); Veeraraghavan Basker, Schenectady, NY (US); Alexander Reznicek, Troy, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/785,899

(22) Filed: Feb. 10, 2020

(65) Prior Publication Data

US 2021/0249506 A1 Aug. 12, 2021

(51) Int. Cl.
| | |
|---|---|
| *H01L 29/06* | (2006.01) |
| *H01L 21/02* | (2006.01) |
| *H01L 21/762* | (2006.01) |
| *H01L 29/423* | (2006.01) |
| *H01L 29/66* | (2006.01) |
| *H01L 29/786* | (2006.01) |

(52) U.S. Cl.
CPC .... *H01L 29/0653* (2013.01); *H01L 21/02603* (2013.01); *H01L 21/76232* (2013.01); *H01L 29/0673* (2013.01); *H01L 29/42392* (2013.01); *H01L 29/66545* (2013.01); *H01L 29/66742* (2013.01); *H01L 29/78618* (2013.01); *H01L 29/78696* (2013.01)

(58) Field of Classification Search
CPC ......... H01L 21/02603; H01L 21/76232; H01L 21/823412; H01L 29/0649; H01L 29/0653; H01L 29/0673; H01L 29/42392; H01L 29/66545; H01L 29/66742; H01L 29/78618; H01L 29/78696
See application file for complete search history.

(56) References Cited

U.S. PATENT DOCUMENTS

| | | |
|---|---|---|
| 6,914,316 B2 | 7/2005 | Yun et al. |
| 9,246,003 B2 | 1/2016 | Cheng et al. |
| 9,362,355 B1 | 6/2016 | Cheng et al. |

(Continued)

*Primary Examiner* — David C Spalla
(74) *Attorney, Agent, or Firm* — Cantor Colburn LLP; Randall Bluestone (57) ABSTRACT

Embodiments of the invention are directed to a method of performing fabrication operations to form a nanosheet field effect transistor (FET) device. The fabrication operations include forming a nanosheet stack over a portion of a substrate. A first source or drain (S/D) trench is formed adjacent to a first end of the nanosheet stack. A second S/D trench is formed adjacent to a second end of the nanosheet stack. A region of the substrate is removed to form a bottom dielectric isolation (BDI) cavity in the substrate, wherein the BDI cavity is positioned beneath at least the nanosheet stack, the first S/D trench, and the second S/D trench. The BDI cavity is filled with a dielectric material, thereby forming a BDI region positioned beneath at least the nanosheet stack, the first S/D trench, and the second S/D trench.

20 Claims, 6 Drawing Sheets

(56) References Cited

U.S. PATENT DOCUMENTS

| | | | |
|---|---|---|---|
| 9,385,218 B1 | 7/2016 | Cheng et al. | |
| 9,515,138 B1* | 12/2016 | Doris et al. | |
| 9,984,936 B1* | 5/2018 | Xie | B82Y 10/00 |
| 10,083,861 B2 | 9/2018 | Bu et al. | |
| 10,103,238 B1* | 10/2018 | Zang | H01L 29/1079 |
| 10,312,323 B2 | 6/2019 | Cheng et al. | |
| 10,424,639 B1 | 9/2019 | Miao et al. | |
| 2005/0282328 A1 | 12/2005 | Sandhu et al. | |
| 2020/0152734 A1* | 5/2020 | Frougier | H01L 29/0673 |
| 2020/0312956 A1* | 10/2020 | Yeh | H01L 29/78696 |

* cited by examiner

FIG. 13

NANOSHEET TRANSISTOR HAVING PARTIALLY SELF-LIMITING BOTTOM ISOLATION EXTENDING INTO THE SUBSTRATE AND UNDER THE SOURCE/DRAIN AND GATE REGIONS

BACKGROUND

The present invention relates in general to fabrication methods and resulting structures for semiconductor devices. More specifically, the present invention relates to fabrication methods and resulting structures for forming a nanosheet transistor on a substrate of an integrated circuit (IC), wherein the nanosheet transistor includes a partially self-limiting bottom isolation region extending into the substrate and under the transistor's source/drain (S/D) and gate regions.

In contemporary semiconductor device fabrication processes, a large number of semiconductor devices, such as n-type field effect transistors (nFETs) and p-type field effect transistors (pFETs), are fabricated on a single wafer. Non-planar transistor device architectures (e.g., fin-type FETs (FinFETs) and nanosheet FETs) can provide increased device density and increased performance over planar transistors. For example, nanosheet transistors, in contrast to conventional planar FETs, include a gate stack that wraps around the full perimeter of multiple stacked nanosheet channel regions for a reduced device footprint and improved control of channel current flow. Nanosheet transistors also enable full depletion in the nanosheet channel regions and reduce short-channel effects.

To reduce unwanted leakage and parasitic capacitance, nanosheet FETs include dielectric isolation between the active channel regions and the underlying substrate.

SUMMARY

Embodiments of the invention are directed to a method of performing fabrication operations to form a nanosheet field effect transistor (FET) device. The fabrication operations include forming a nanosheet stack over a portion of a substrate. A first source or drain (S/D) trench is formed adjacent to a first end of the nanosheet stack. A second S/D trench is formed adjacent to a second end of the nanosheet stack. A region of the substrate is removed to form a bottom dielectric isolation (BDI) cavity in the substrate, wherein the BDI cavity is positioned beneath at least the nanosheet stack, the first S/D trench, and the second S/D trench. The BDI cavity is filled with a dielectric material, thereby forming a BDI region positioned beneath at least the nanosheet stack, the first S/D trench, and the second S/D trench.

Embodiments of the invention are directed to a method of performing fabrication operations to form a nanosheet FET device. The fabrication operations include forming a nanosheet stack over a sub-fin of a substrate. A first S/D trench is formed adjacent to a first end of the nanosheet stack. A second S/D trench is formed adjacent to a second end of the nanosheet stack. A region of the sub-fin is removed to form a BDI cavity in the sub-fin, wherein the BDI cavity is positioned beneath at least the nanosheet stack, the first S/D trench, and the second S/D trench. The BDI cavity is filled with a dielectric material, thereby forming a BDI region positioned beneath at least the nanosheet stack, the first S/D trench, and the second S/D trench.

Embodiments of the invention are directed to a nanosheet FET device configured to include a nanosheet stack over a portion of a substrate. A first source or drain (S/D) region is adjacent to a first end of the nanosheet stack. A second S/D region is adjacent to a second end of the nanosheet stack. A BDI region is formed in the substrate, wherein the BDI region is positioned beneath at least the nanosheet stack, the first S/D region, and the second S/D region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-13 depict multiple cross-sectional views of a nanosheet-based structure after various fabrication operations for forming a nanosheet transistor on a substrate of an IC, wherein the nanosheet transistor includes a partially self-limiting BDI region extending into the substrate and under the transistor's S/D and gate regions in accordance with aspects of the invention, in which:

DETAILED DESCRIPTION

Although this detailed description includes examples of how aspects of the invention can be implemented to form a peaked BDI structure in an exemplary gate-all-around (GAA) nanosheet FET architecture having silicon (Si) channel nanosheets and SiGe sacrificial nanosheets, implementation of the teachings recited herein are not limited to a particular type of FET structure or combination of materials. Rather, embodiments of the present invention are capable of being implemented in conjunction with any other type of transistor device or material, now known or later developed, wherein it is desirable to provide improved electrical isolation of the S/D regions and the gate from the underlying substrate.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet FETs that provide the performance characteristics required for a particular application. For example, to reduce leakage and parasitic capacitance, it is necessary to provide nanosheet FETs with a so-called "bottom" dielectric isolation (BDI) region between the active channel of the nanosheet FET and the underlying substrate. Theoretically, BDI would be provided by forming a dielectric layer (e.g., $SiO_2$) over the substrate then forming the initial stack of alternating channel nanosheets and sacrificial nanosheets over the dielectric layer. However, this approach is not practical because the semiconductor materials (e.g., Si, SiGe) from which the stack of alternating channel and sacrificial nanosheets are formed cannot be epitaxially grown at high quality levels (e.g., as single crystal material) from the dielectric layer. Accordingly, alternative methods of forming BDI have been developed, including, for example, growing a sacrificial nanosheet layer at the bottom of the nanosheet stack then replacing the sacrificial nanosheet layer with dielectric isolation material to form the BDI.

In known nanosheet fabrication techniques, S/D trenches are formed at opposite ends of the nano sheet stack such that the bottom surfaces of the S/D trenches are defined by a top surface of the underlying semiconductor substrate. Single crystalline doped S/D semiconductor regions are formed in the S/D trenches by epitaxially growing single crystalline doped semiconductor material from exposed single crystalline semiconductor material in the S/D trenches. The exposed single crystalline semiconductor material in the S/D trenches includes ends of the channel nanosheets and the top surface of the underlying substrate. A shortcoming of such fabrication techniques is that growing part of the S/D regions from the underlying substrate places the S/D regions on opposite sides of the BDI region, thereby creating additional parasitic capacitance under the nanosheet stack.

Turning now to an overview of aspects of the invention, embodiments of the invention provide fabrication methods and resulting structures for forming a nanosheet transistor on a substrate of an IC, wherein the nanosheet transistor includes a partially self-limiting BDI region configured and arranged to extend into the substrate and under the transistor's S/D and gate regions. In embodiments of the invention, the unwanted parasitic capacitance that results from having a direct electrical coupling between the S/D regions and the substrate is avoided by forming the BDI region such that it extends under both the nanosheet stack and the S/D regions of the transistor. In embodiments of the invention, the BDI region is formed by forming a BDI cavity in portions of the substrate that are underneath the nanosheet stack and the S/D trenches then filling the BDI cavity with a dielectric.

In some embodiments of the invention, the BDI cavity is formed within the substrate by exposing portions of the substrate at the location over the substrate where the S/D regions will be formed. In embodiments of the invention, portions of the substrate are exposed by forming first and second S/D trenches at opposite ends of the nanosheet stack such that bottom surfaces of the first and second S/D trenches are defined by first and second exposed portions of the underlying semiconductor substrate. Prior to forming the S/D regions in the first and second S/D trenches, an isotropic etchant is applied to the first and second exposed portions of the substrate, thereby etching into the substrate. In some embodiments of the invention, the substrate etch is partially self-limiting in that it is controlled by time and the planar orientations of the underlying substrate. In some embodiments of the invention, the underlying substrate is a single crystalline semiconductor material (e.g., Si) having a {100} orientation at its top surface. As the etch process proceeds, {111} planes of the substrate are exposed such that both {100} and {111} planes of the substrate are being etched. The {100} planes etch the fastest and the {111} planes etch the slowest, thus resulting in the first and second exposed portions of the substrate forming two sloped surfaces that eventually merge to form and define a BDI cavity that extends under both the nanosheet stack and the S/D trench. As the etch proceeds further, the first and second exposed surfaces become completely {111} faceted, and the etch speed slows to the relatively slower etch speed dictated by the {111} surfaces, thereby forming a {111} faceted bottom surface of the BDI cavity. The etch will continue at the relatively slower speed until final BDI cavity depth is reached and the etchant is removed. Because the etch speed after the bottom surface of the BDI cavity becomes {111} is relatively slow and can be calculated, the overall substrate etch process and the final BDI cavity's depth can be well-controlled.

Figure 7:
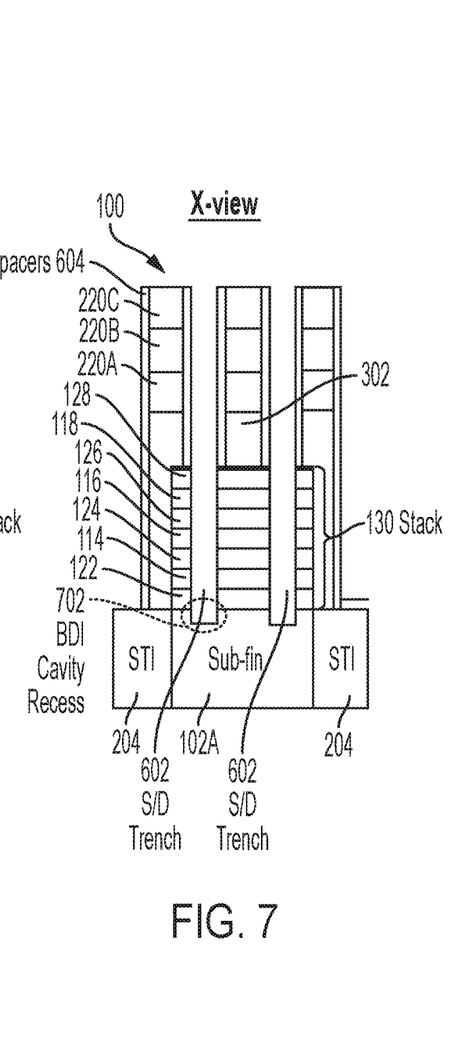
FIG. 7 depicts a cross-sectional view of the nanosheet-based structure after additional fabrication operations in accordance with aspects of the present invention.
Figures 8, 9, 10:
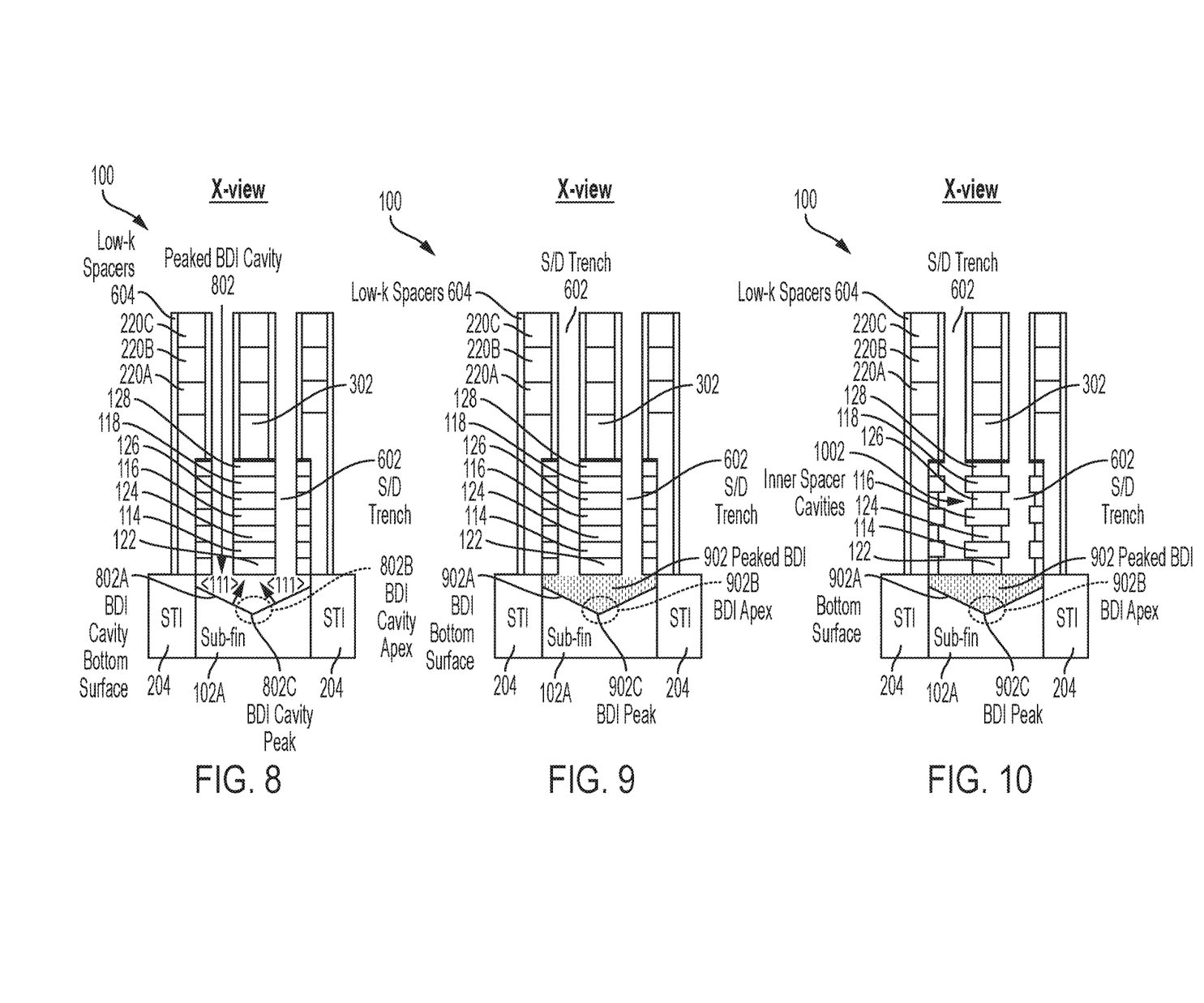
FIG. 8 depicts a cross-sectional view of the nanosheet-based structure after additional fabrication operations in accordance with aspects of the present invention.
FIG. 9 depicts a cross-sectional view of the nanosheet-based structure after additional fabrication operations in accordance with aspects of the present invention.
FIG. 10 depicts a cross-sectional view of the nanosheet-based structure after additional fabrication operations in accordance with aspects of the present invention.

Turning now to a more detailed description of fabrication operations and resulting structures according to aspects of the invention, FIGS. 1-13 depict a nanosheet-based structure 100 after various fabrication operations for forming nanosheet FETs having a BDI region 902 (shown in FIG. 9). For ease of illustration, the fabrication operations depicted in FIGS. 1-13 will be described in the context of forming a single nanosheet stack 130 (shown in FIG. 1), it is intended that fabrication operations described herein apply equally to the fabrication of any number of nanosheet stacks.

Figure 1:
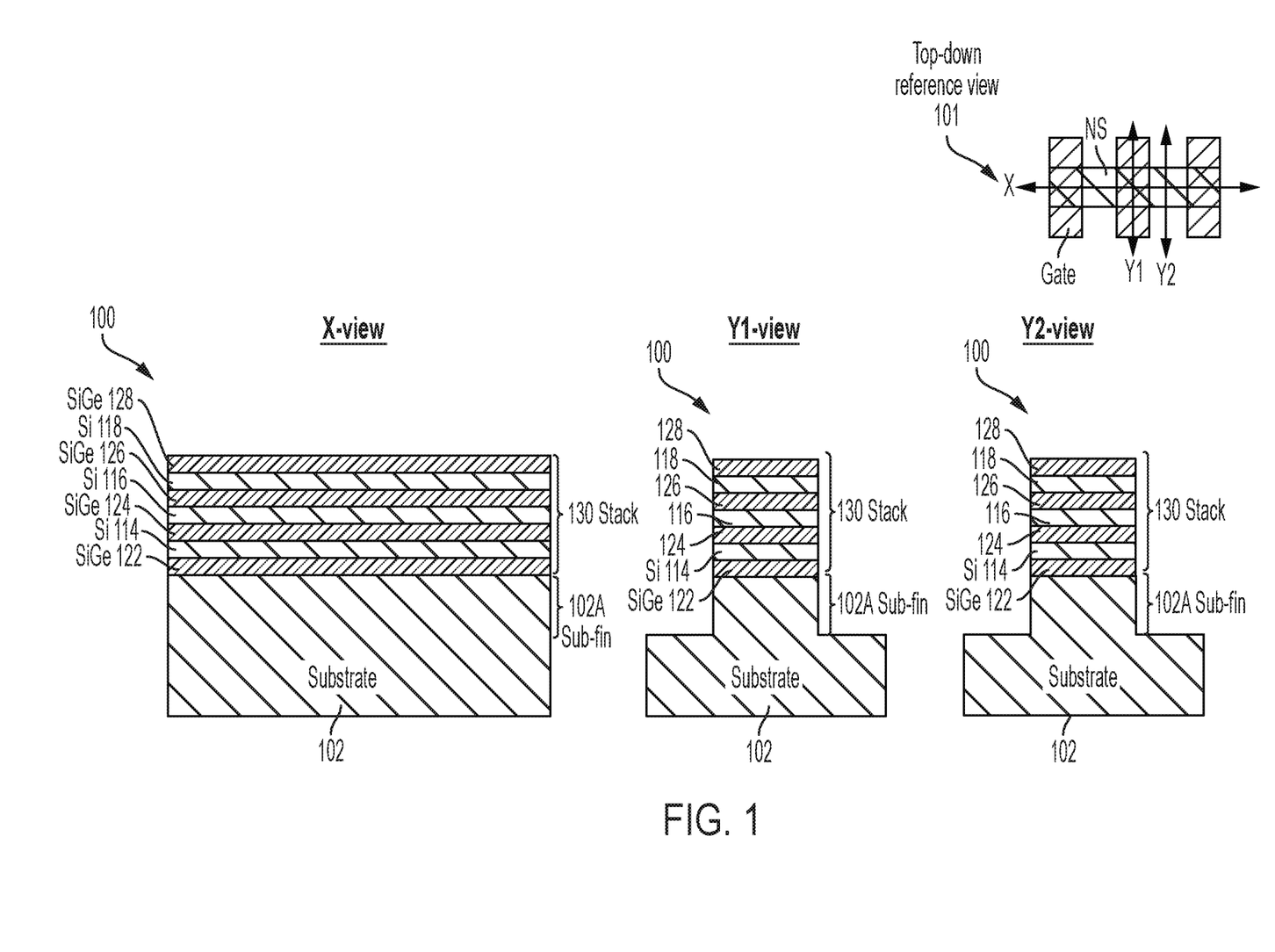
FIG. 1 depicts cross-sectional views of the nanosheet-based structure after initial fabrication operations in accordance with aspects of the present invention.

Although the cross-sectional diagrams depicted in FIGS. 1-13 are two-dimensional, it is understood that the diagrams depicted in FIGS. 1-13 represent three-structures. The top-down reference diagram 101 shown in FIG. 1 provides a reference point for the various cross-sectional views (X-view, Y1-view, and Y2-view) shown in FIGS. 1-13. The X-view is a side view taken across the three gates, the Y1-view is an end view taken through the active gate, and the Y2-view is an end view taken through a portion of the nanosheet (NS) stack where one of the S/D regions is (or will be) formed.

FIG. 1 depicts cross-sectional views of the nanosheet-based structure 100 after initial fabrication operations in accordance with aspects of the present invention. As shown in FIG. 1, a nanosheet stack 130 is formed over the substrate 102. The nanosheet stack 130 includes an alternating series of SiGe sacrificial nanosheet layers 122, 124, 126, 128 and Si nanosheet layers 114, 116, 118. In accordance with aspects of the invention, the alternating layers 122, 114, 124, 116, 126, 118, 128 of the nanosheet stack 130 are formed by epitaxially growing one layer and then the next until the desired number and desired thicknesses of the nanosheet layers are achieved. Although seven alternating layers 122, 114, 124, 116, 126, 118, 128 are depicted in the figures, any number of alternating layers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments of the invention, the SiGe sacrificial nanosheet layers 122, 124, 126, 128 can be SiGe30%. The notation "SiGe 30%" is used to indicate that 30% of the SiGe material is Ge and 70% of the SiGe material is Si. In some embodiments of the invention, the Ge percentage in the SiGe sacrificial nanosheet layers 122, 124, 126, 128 can be any value, including, for example a value within the range from about 20% to about 45%.

As shown in FIG. 1, known fabrication operations (e.g., ALD) have been used to deposit a hard mask layer (not shown) over an initial nanosheet stack (not shown) then patterned and etched to define the nanosheet stack 130 and the sub-fin 102A of the substrate 102. The hard mask layer can be any suitable dielectric, including but not limited to SiN.

Figure 2:
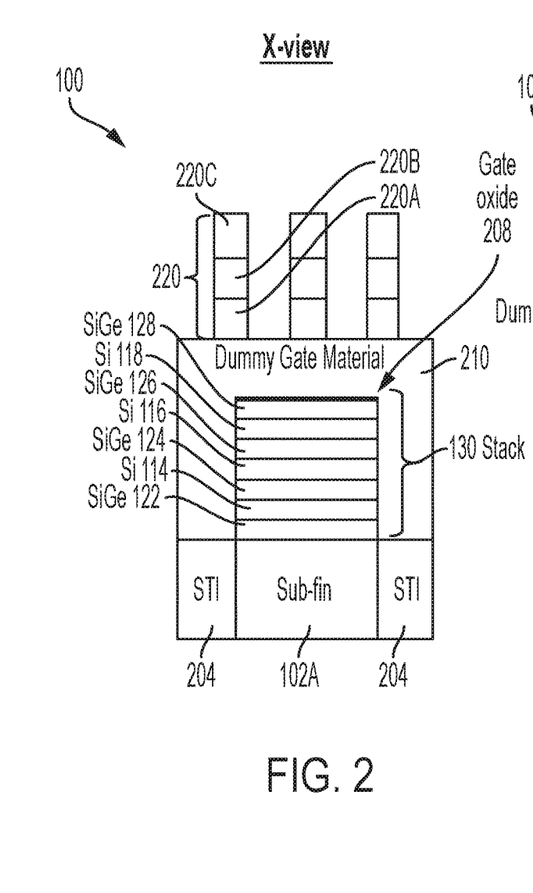
FIG. 2 depicts a cross-sectional view of the nanosheet-based structure after additional fabrication operations in accordance with aspects of the present invention.

In FIG. 2, known fabrication operations have been used to form STI regions 204 adjacent to the sub-fin 102A and above the substrate 102 (shown in FIG. 1). In embodiments of the invention, the STI regions 204 can be formed by depositing then planarizing a fill material (not shown). The fill material is recessed to form the STI regions 204. In embodiment of the invention, the fill material can be an oxide such as $SiO_2$.

Referring still to FIG. 2, known fabrication operations have been used to deposit a thin layer of gate oxide 208 over the nanosheet stack 130 then deposit and planarize a layer of dummy gate material 210 over the gate oxide 208. In some embodiments of the invention, the gate oxide 208 can be a so-called "extended gate" (EG) oxide. In order to increase the maximum gate voltage (e.g., the transistor threshold voltages $V_T$) of the nanosheet-based structure 100, the volume of the final gate (e.g., the high-k metal gate (HKMG) 1302 shown in FIG. 13) can be increased, and the volume/thickness of the gate oxide 208 can be increased. Gate oxides that have been increased to accommodate a relatively larger gate volume and maximum gate voltage are referred to as EG oxides. In some embodiments of the invention, the dummy gate material 210 can be polycrystalline Si. In some embodiments of the invention, the dummy gate material 210 can be amorphous Si (a-Si). After being deposited, the dummy gate material 210 is planarized (e.g., by CMP) to a desired level.

Referring still to FIG. 2, known semiconductor fabrication operations have been used to form a multi-layered patterned/etched hard masks 220 on a top surface of the dummy gate material 210. The pattern used to form the multi-layered hard masks 220 defines the footprints of the dummy gates 302 (shown in FIG. 3) and the gate oxide 208. In embodiments of the invention, the multi-layered hard masks 220 can include hard mask and patterning layers 220A, 220B, 220C formed from oxide and/or nitride materials. In embodiments of the invention, the hard masks 220 can be formed by depositing layers of hard mask material and patterning materials then etching the deposited layers to form the multi-layered hard masks 220.

Figure 3:
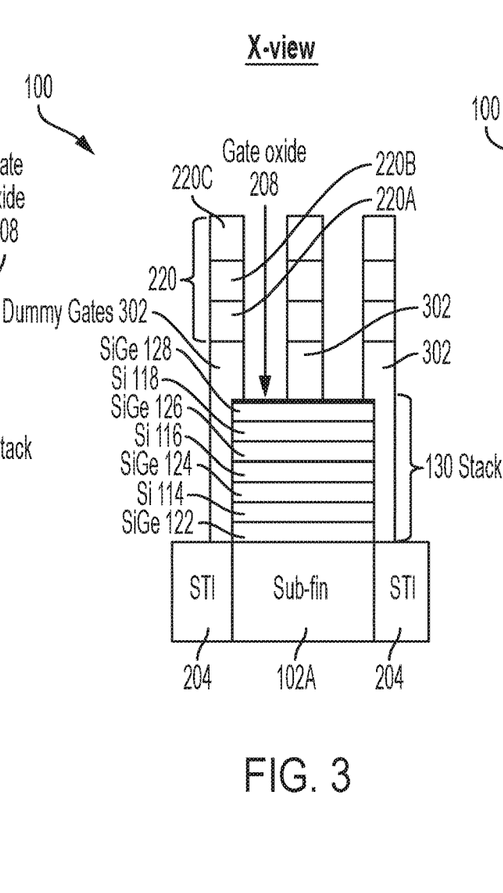
FIG. 3 depicts a cross-sectional view of the nanosheet-based structure after additional fabrication operations in accordance with aspects of the present invention.

In FIG. 3, known fabrication operations (e.g., an RIE) have been used to form dummy gates 302. In embodiments of the invention, the dummy gates 302 can be formed by selectively etching the dummy gate material 210 (shown in FIG. 2) such that portions of the dummy gate material 210 that are not under the multi-layered hard masks 220 are selectively removed, thereby forming the dummy gates 302 over the nanosheet stack 130.

Figure 4:
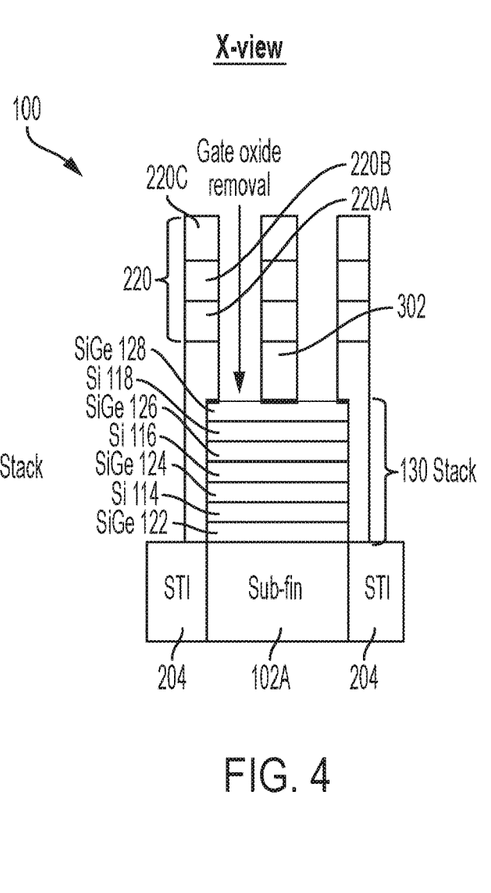
FIG. 4 depicts a cross-sectional view of the nanosheet-based structure after additional fabrication operations in accordance with aspects of the present invention.

In FIG. 4, known fabrication operations have been used to selectively remove the portions of the gate oxide that are not under the dummy gates 302, and a DHF cleaning is performed to ensure that all of the gate oxide that is not under the dummy gates 302 has been removed.

Figures 5, 6:
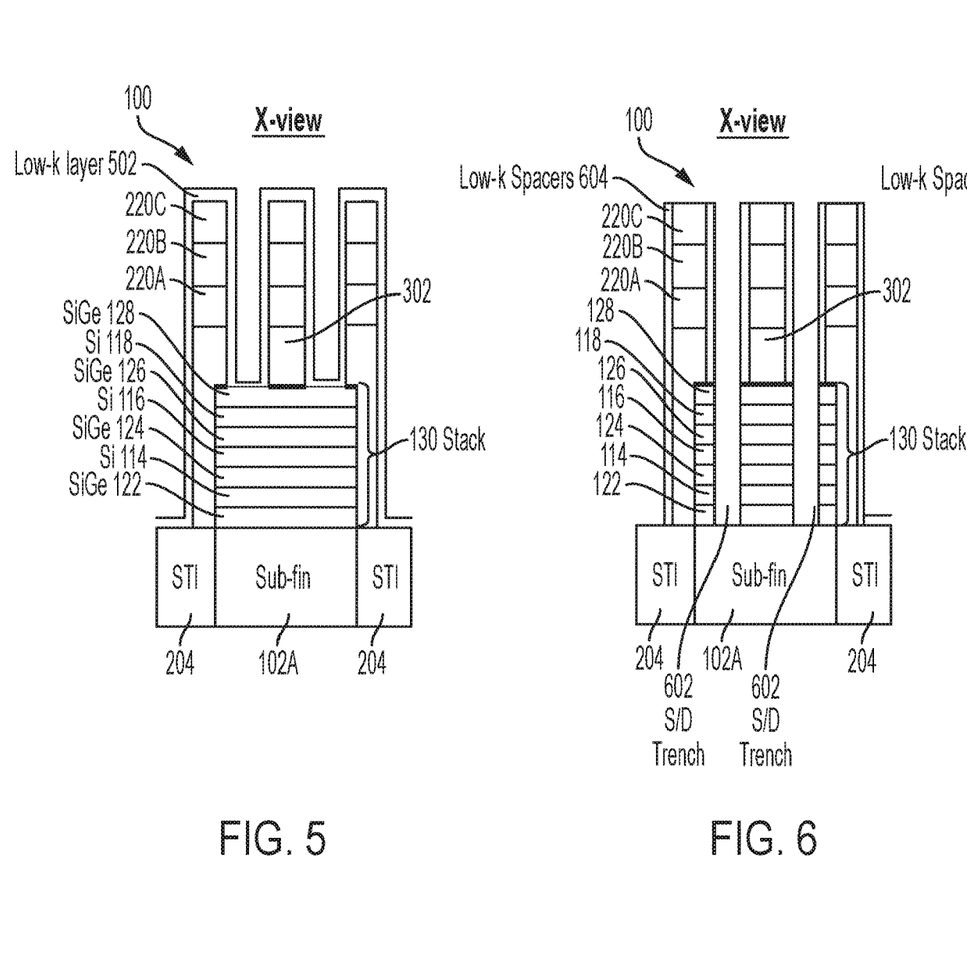
FIG. 5 depicts a cross-sectional view of the nanosheet-based structure after additional fabrication operations in accordance with aspects of the present invention.
FIG. 6 depicts a cross-sectional view of the nanosheet-based structure after additional fabrication operations in accordance with aspects of the present invention.

In FIG. 5, known semiconductor fabrication operations (e.g., ALD) are used deposit a dielectric layer 502 over the nanosheet-based structure 100. In some embodiments of the invention, the dielectric layer 502 can include silicon oxide, silicon nitride, silicon oxynitride, SiBCN, SiOCN, SiOC, or any suitable combination of those materials. In some embodiments of the invention, the dielectric layer 502 can be a low-k dielectric material.

In FIG. 6, known fabrication operations have been used to form to form offset gate spacers 604 on sidewalls of the dummy gates 302 by directionally etching (e.g., using an RIE) the dielectric layer 502 (shown in FIG. 5) to form the gate spacers 604.

Referring still to FIG. 6, the portions of the nanosheet stack 130 that are not covered by the gate spacers 604 and the dummy gates 302 are etched, thereby forming multiple instances of the nanosheet stack 130 having formed thereon the dummy gates 302 and the gate spacers 604; forming S/D trenches 602 in which the S/D regions 1202, 1204 (shown in FIG. 12) will be formed; providing access to end regions of the sacrificial nanosheets 122, 124, 126, 128; and exposing portions of the top surface of the sub-fin 102A.

In FIG. 7, a directional etch is applied to the exposed portions of the top surface of the sub-fin 102A to recess the exposed portions of the top surface of the sub-fin 102A to just below the non-exposed top surface of the sub-fin 102A.

In FIG. 8, a facetted or isotropic etch (wet or dry) has been applied to the recessed surfaces (shown in FIG. 7) of the sub-fin 102A to form a peaked BDI cavity 802 having {111} faceted bottom surfaces 802A, a cavity apex region 802B, and a peak region 802C, configured and arranged as shown. In embodiments of the invention, the isotropic etch is partially self-limiting in that it is controlled by time and the planar orientations of the underlying sub-fin 102A. In embodiments of the invention, the sub-fin 102A is a single crystalline semiconductor material (e.g., Si) having a {100} orientation at its top surface. As the etch process proceeds, {111} planes of the sub-fin 102A are exposed such that both {100} and {111} planes of the sub-fin 102A are being etched. The {100} planes etch the fastest and the {111} planes etch the slowest, thus resulting in the exposed portions of the sub-fin 102A forming the BDI cavity bottom surfaces 802A as two sloped surfaces that eventually merge to form the BDI cavity 802 such that it extends under both the nanosheet stack 130 and the S/D trenches 602. As the etch proceeds further, the BDI cavity bottom surfaces 802A become completely {111} faceted, and the etch speed slows to the relatively slower etch speed dictated by the {111} surfaces. The etch is continued at the relatively slower speed until a final depth of the BDI cavity 802 at the peak region 802C is reached and the etchant is removed. Because the etch speed after the bottom surfaces 802A of the BDI cavity 802 become {111} is relatively slow and can be calculated, the overall sub-fin etch process and the final depth of the BDI cavity 802 can be well-controlled.

In FIG. 9, known fabrication operations have been used to fill the BDI cavity 802 with a dielectric material, thereby forming a peaked BDI region 902 having bottom surfaces 902A that match the {111} BDI cavity surfaces 802A, a BDI apex region 902B, and a peak region 902C, configured and arranged as shown. In embodiments of the invention, sidewalls of the BDI region are bound by the STI regions 204, and the BDI bottom surfaces 902A are bound by the sub-fin 102A of the substrate 102. In the final nanosheet-sheet based structure 100 (shown in FIG. 13), the top surface of the BDI region 902 is bound by the S/D regions 1202, 1204, the inner spacers 1102, and the HKMG 1302. In embodiments of the invention, a high pressure deposition (HPD) process is used to fill the BDI cavity 802A with the dielectric material. In embodiments of the invention, the HPD process comprises deposition processes that use pressure to cause the material deposited in a space to completely fill the space, leaving no voids in the deposited material. In embodiments of the invention, the HPD process comprises deposition processes that use pressure to cause the material deposited in a space to completely fill the space, leaving substantially no voids in the deposited material. In embodiments of the invention, the dielectric material used to form the peaked BDI region 902 can include silicon oxide, silicon nitride, silicon oxynitride, SiBCN, SiOCN, SiOC, or any suitable combination of those materials.

Figure 12:
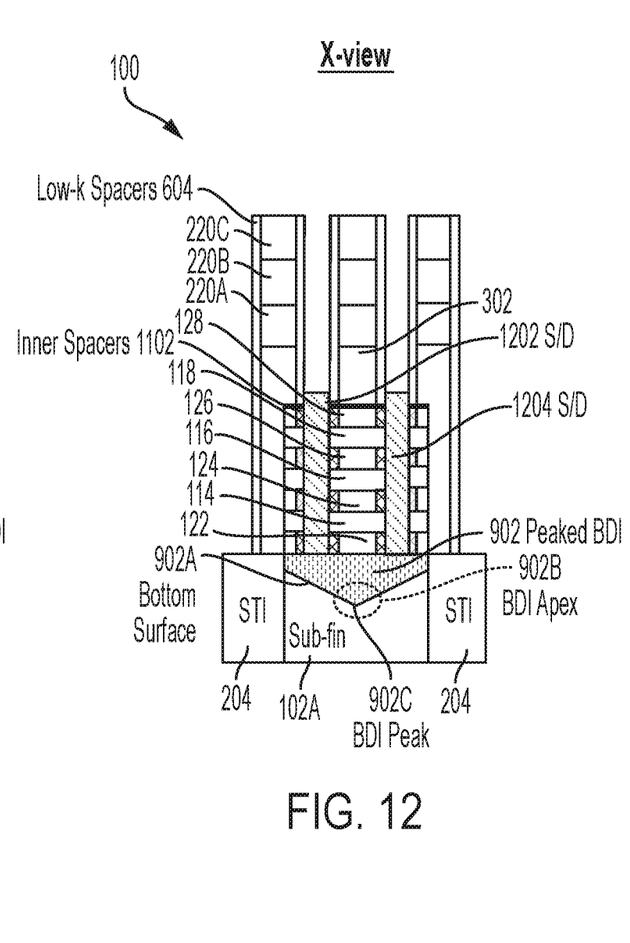
FIG. 12 depicts a cross-sectional view of the nanosheet-based structure after additional fabrication operations in accordance with aspects of the present invention.

Referring still to FIG. 9, In accordance with aspects of the invention, the BDI region 902 is configured and arranged to extend into the substrate 102 through the sub-fin 102A, and to extend under the channels 114, 116, 118, gate regions 1302 (shown in FIG. 13), and doped S/D regions 1202, 1204 (shown in FIG. 12). In embodiments of the invention, the unwanted parasitic capacitance that would result from having a direct electrical coupling between the S/D regions 1202, 1204 and the substrate 102 is avoided by forming the BDI region 902 such that it extends under both the nanosheet stack 130 (best shown in FIG. 7) and the S/D regions 1202, 1204 of the nanosheet-based structure 100.

In FIG. 10, known semiconductor fabrication processes have been used to partially remove end regions of the sacrificial nanosheet regions 122, 124, 126, 128 to form end region or inner spacer cavities 1002. In embodiments of the invention, the end regions of the sacrificial nanosheets 122, 124, 126, 128 can be removed using a so-called "pull-back" process to pull the SiGe sacrificial nanosheet regions 122, 124, 126, 128 back an initial pull-back distance such that the ends of the sacrificial nanosheets 122, 124, 126, 128 now terminate at about an inner edge of the gate spacers 604. In embodiments of the invention, the pull-back process leverages the fact that the sacrificial nano sheets 122, 124, 126, 128 are formed from SiGe, which can be selectively etched with respect to the Si channel nanosheets 114, 116, 118 using, for example, a vapor phase hydrogen chloride (HCL) gas isotropic etch process.

Figure 11:
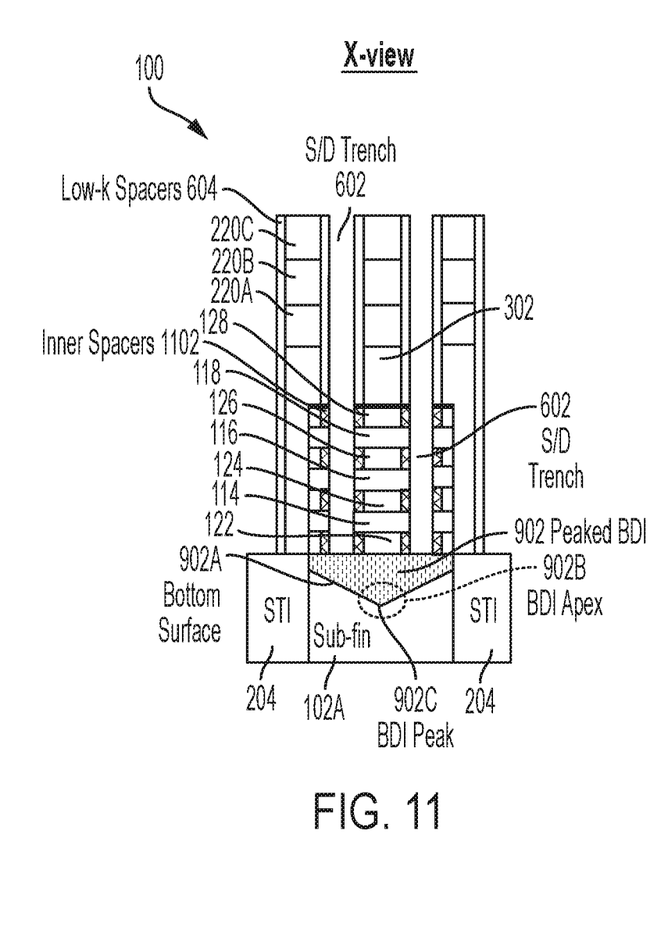
FIG. 11 depicts a cross-sectional view of the nanosheet-based structure after additional fabrication operations in accordance with aspects of the present invention.

In FIG. 11, known semiconductor device fabrication processes have been used to form inner spacers 1102 in the cavities 1002 formed in the end regions of the sacrificial nanosheets 122, 124, 126, 128. In embodiments of the invention, the inner spacers 1102 can be formed using, e.g., a conformal deposition process to deposit a dielectric over the end region cavities 1002 such that dielectric pinches off in the end region cavities 1002 to form the inner spacers 1102. A subsequent isotropic or anisotropic etch back is performed to remove excess dielectric material on exposed vertical and horizontal surfaces of the structure 100. The inner spacers 1102 can be silicon nitride, silicoboron carbonitride, silicon carbonitride, silicon carbon oxynitride, or any other type of dielectric material (e.g., a dielectric material having a dielectric constant k of less than about 5).

In FIG. 12, known fabrication operations have been used to form a doped S/D region 1202 and a doped S/D region 1204 on the end regions of the channel nanosheets 114, 116, 118, thereby creating initial p/n junctions at the interfaces between the channel nanosheets 114, 116, 118 and the S/D regions 1202, 1204. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

The doped S/D regions 1202, 1204 can be formed by a variety of methods, such as, for example, in-situ doped epitaxy, doping following the epitaxy, implantation and plasma doping, ultrahigh vacuum chemical vapor deposition (UHVCVD), rapid thermal chemical vapor deposition (RT-CVD), metal organic chemical vapor deposition (MOCVD), low-pressure chemical vapor deposition (LPCVD), limited reaction processing CVD (LRPCVD), and MBE. In some embodiments of the invention, the doped S/D regions 1202, 1204 can be doped during deposition (in-situ doped) by adding dopants such as n-type dopants (e.g., phosphorus or arsenic) or p-type dopants (e.g., Ga, B, BF$_2$, or Al). To reduce S/D contact resistance, the doped S/D regions 1202, 1204 can be highly doped and can be formed from Si$_{1-x}$Ge$_x$ having a higher Ge % (e.g., Ge %≥about 50%). In embodiments of the invention, the Ge % in the Si$_{1-x}$Ge$_x$ embodiments of the S/D regions 1202, 1204 can be selected to maximize the dopant solubility in the Si$_{1-x}$Ge$_x$ S/D regions 1202, 1204. For example, it is generally accepted that a Ge % that can maximize the B solubility in Si$_{1-x}$Ge$_x$ embodiments of the S/D regions 1202, 1204 is a Ge %≥about 65%.

Figure 13:
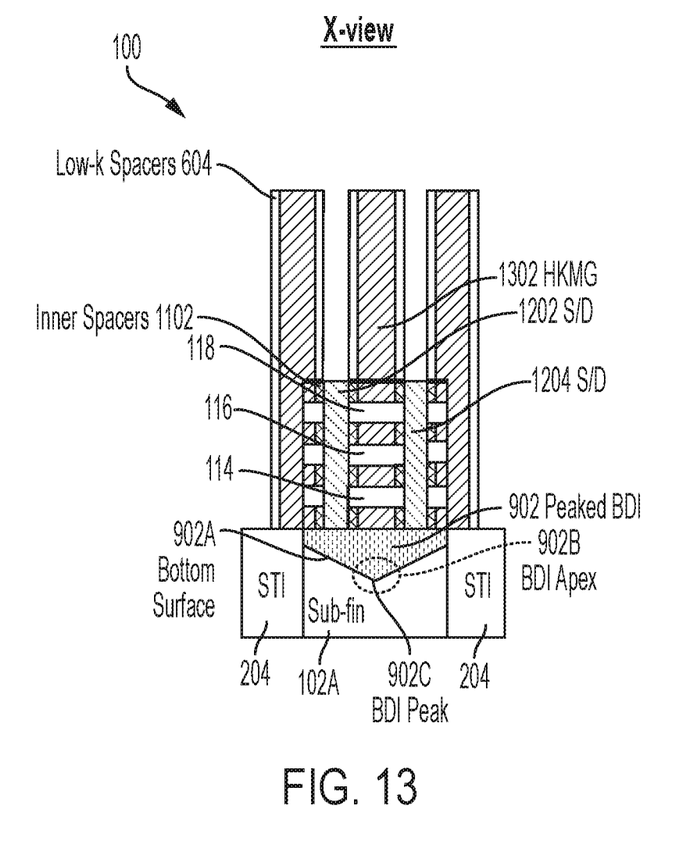
FIG. 13 depicts a cross-sectional view of the nanosheet-based structure after additional fabrication operations in accordance with aspects of the present invention.

In FIG. 13, known fabrication operations have been used to remove the sacrificial nanosheet layers 122, 124, 126, 128 and the dummy gates 302. The dummy gates 302 and the gate dielectric can be removed by a known etching process, e.g., RIE or wet removal process. Known semiconductor fabrication operations have also been used to remove the SiGe sacrificial nanosheets 122, 124, 126, 128. In embodiments of the invention, the sacrificial nanosheets 122, 124, 126, 128 are formed from SiGe, which can be selectively etched with respect to the Si channel nanosheets 114, 116, 118 using, for example, a vapor phase hydrogen chloride (HCL) gas isotropic etch process.

Referring still to FIG. 13, known fabrication operations have been used to replace the removed sacrificial nanosheet layers 122, 124, 126, 128 and the removed dummy gates 302 with a HKMG structure 1302 having a dielectric layer (not shown separately) and a metal gate structure (not shown separately). The metal gate structure can include metal liners and work-function metals (WFM). In embodiments of the invention, the WFM can be, for example, TiN or TaN, and the metal gate structure can be aluminum or tungsten. The dielectric layer can include interfacial layers (IL) and high-k dielectric layers. In some embodiments of the invention, the high-k dielectric layers can modify the work function of the WFM. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

Referring still to FIG. 13, the HKMG 1302 surrounds the stacked nanosheet channels 114, 116, 118 and regulates electron flow through the nanosheet channels 114, 116, 118 between the S/D region 1202 and the S/D region 1204.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent to, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of performing fabrication operations to form a nanosheet field effect transistor (FET) device, wherein the fabrication operations include:

forming a multi-layered nanosheet stack over a portion of a substrate;

wherein the multi-layered nanosheet stack comprises a sacrificial layer and a non-sacrificial layer;

wherein the substrate does not include the non-sacrificial layer of the multi-layered nanosheet stack;

forming a first source or drain (S/D) trench adjacent to a first end of the multi-layered nanosheet stack;

forming a second S/D trench adjacent to a second end of the multi-layered nanosheet stack;

removing a region of the substrate, wherein the space that was occupied by the region of the substrate defines a bottom dielectric isolation (BDI) cavity in the substrate, wherein the BDI cavity is positioned beneath at least the multi-layered nanosheet stack, the first S/D trench, and the second S/D trench; and filling the BDI cavity with a dielectric material, thereby forming a BDI region positioned beneath at least the multi-layered nanosheet stack, the first S/D trench, and the second S/D trench.

2. The method of claim 1, wherein filling the BDI cavity with a dielectric material comprises applying a high pressure deposition (HPD) process configured to use pressure to ensure that the dielectric material fills the BDI cavity such that no or substantially no voids are in the deposited dielectric material.

3. The method of claim 1, wherein removing the region of the substrate to form the BDI cavity in the substrate occurs prior to forming:

a first S/D region in the first S/D trench; and a second S/D region in the second S/D trench.

4. The method of claim 3, wherein filling the BDI cavity with the dielectric material occurs prior to forming:

the first S/D region in the first S/D trench; and prior to forming a second S/D region in the second S/D trench.

5. The method of claim 1, wherein the portion of the substrate comprises a substrate top surface.

6. The method of claim 5, wherein a bottom surface of the first S/D trench comprises a first portion of the substrate top surface.

7. The method of claim 6, wherein a bottom surface of the second S/D trench comprises a second portion of the substrate top surface.

8. The method of claim 7, wherein removing the region of the substrate to form the BDI cavity comprises applying a first type of etch operations to the first portion of the substrate top surface to form a first initial BDI cavity.

9. The method of claim 8, wherein removing the region of the substrate to form the BDI cavity further comprises applying the first type of etch operations to the second portion of the substrate top surface to form a second initial BDI cavity.

10. The method of claim 9, wherein removing the region of the substrate to form the BDI cavity further comprises applying a second type of etch operations to the first initial BDI cavity, and applying the second type of etch operations to the second initial BDI cavity until the first initial BDI cavity merges with the second initial BDI cavity to form the BDI cavity.

11. The method of claim 10, wherein the first type of etch operations comprises a directional etch operation.

12. The method of claim 11, wherein the second type of etch operations comprises an isotropic etch operation.

13. A method of performing fabrication operations to form a nanosheet field effect transistor (FET) device, wherein the fabrication operations include:
- forming a nanosheet stack over a sub-fin of a substrate;
- forming a first source or drain (S/D) trench adjacent to a first end of the nanosheet stack;
- forming a second S/D trench adjacent to a second end of the nanosheet stack;
- removing a region of the sub-fin to form a bottom dielectric isolation (BDI) cavity in the substrate, wherein the BDI cavity is positioned beneath at least the nanosheet stack, the first S/D trench, and the second S/D trench; and
- applying pressure to a dielectric material to fill the BDI cavity with the dielectric material, thereby forming a BDI region positioned beneath at least the nanosheet stack, the first S/D trench, and the second S/D trench.

14. The method of claim 13, wherein:
- a high pressure deposition (HPD) process is used to apply the pressure to the dielectric material; and
- the HPD process is configured to use amounts of the pressure that are sufficient to cause the dielectric material to fill the BDI cavity such that no or substantially no voids are in the deposited dielectric material.

15. The method of claim 13, wherein removing the region of the sub-fin to form the BDI cavity in the sub-fin occurs prior to forming:
- a first S/D region in the first S/D trench; and
- a second S/D region in the second S/D trench.

16. The method of claim 15, wherein filling the BDI cavity with the dielectric material occurs prior to forming:
- the first S/D region in the first S/D trench; and
- prior to forming a second S/D region in the second S/D trench.

17. The method of claim 13, wherein:
- the sub-fin comprises a sub-fin top surface;
- a bottom surface of the first S/D trench comprises a first portion of the sub-fin top surface;
- a bottom surface of the second S/D trench comprises a second portion of the sub-fin top surface;
- removing the region of the sub-fin to form the BDI cavity comprises applying a first type of etch operations to the first portion of the sub-fin top surface to form a first initial BDI cavity;
- removing the region of the sub-fin to form the BDI cavity further comprises applying the first type of etch operations to the second portion of the sub-fin top surface to form a second initial BDI cavity; and
- removing the region of the sub-fin to form the BDI cavity further comprises applying a second type of etch operations to the first initial BDI cavity, and applying the second type of etch operations to the second initial BDI cavity until the first initial BDI cavity merges with the second initial BDI cavity to form the BDI cavity.

18. The method of claim 10, wherein:
- the first type of etch operations comprises a directional etch operation; and
- the second type of etch operations comprises an isotropic etch operation.

19. A nanosheet field effect transistor (FET) device comprising:
- a nanosheet stack over a portion of a substrate;
- a first source or drain (S/D) region adjacent to a first end of the nanosheet stack;
- a second S/D region adjacent to a second end of the nanosheet stack; and
- a bottom dielectric isolation (BDI) region formed in the substrate and comprising a dielectric material;
- wherein the BDI region is positioned beneath at least the nanosheet stack, the first S/D region, and the second S/D region; and
- wherein the BDI region further comprises a faceted bottom surface.

20. The device of claim 19, wherein the dielectric material of BDI region comprises a pressure-deposited dielectric material that fills a BDI cavity defined by the BDI region such that no or substantially no voids are in the pressure-deposited dielectric material.

* * * * *